United States Patent
Schnizlein

Patent Number: 5,923,704
Date of Patent: Jul. 13, 1999

[54] TRANSMIT CLOCK GENERATION SYSTEM AND METHOD

[75] Inventor: Paul Schnizlein, Austin, Tex.

[73] Assignee: Advanced Micro Devices, Inc., Sunnyvale, Calif.

[21] Appl. No.: 08/740,836

[22] Filed: Nov. 4, 1996

Related U.S. Application Data

[63] Continuation-in-part of application No. 08/620,902, Mar. 25, 1996, abandoned.

[51] Int. Cl.$^6$ ........................................... H04B 1/38
[52] U.S. Cl. ..................... 375/219; 375/222; 375/371; 375/373
[58] Field of Search ..................... 375/219, 222, 375/358, 362, 371, 373, 376; 331/74, 75

[56] References Cited

U.S. PATENT DOCUMENTS

| | | | |
|---|---|---|---|
| 4,216,544 | 8/1980 | Boleda et al. . | |
| 4,451,916 | 5/1984 | Casper et al. | 370/16 |
| 4,495,617 | 1/1985 | Ampulski et al. . | |
| 5,111,451 | 5/1992 | Piasecki et al. | 370/29 |
| 5,166,629 | 11/1992 | Watkins et al. | 328/14 |
| 5,256,994 | 10/1993 | Langendorf | 331/16 |
| 5,592,128 | 1/1997 | Hwang | 331/61 |
| 5,635,875 | 6/1997 | Kusakabe | 331/1 |

FOREIGN PATENT DOCUMENTS

WO 82/03736  10/1982  WIPO .

*Primary Examiner*—Stephen Chin
*Assistant Examiner*—Mohammad Ghayour

[57] ABSTRACT

A method for generating transmit clock timing of a first communications unit of a communications system. The communications system includes the first communications unit and a second communications unit, each capable of communications with the other. The first communications unit has a first internal clock and the second communications unit has a second internal clock. According to one example embodiment, the method includes the steps of receiving a receive data signal by the first communications unit from the second communications unit, adjusting a receive reference clock to the receive data signal to generate an adjusted receive reference clock that tracks the receive data signal, accumulating the adjustments made in the adjusting step, applying the adjustments accumulated to vary the first internal clock in order to slave the first internal clock to the second internal clock of the second communications unit so as to generate an adjusted receive reference clock that is the adjusted and slaved first internal clock, and deriving a transmit clock from the adjusted receive reference clock.

20 Claims, 3 Drawing Sheets

TRANSMIT CLOCK GENERATION SYSTEM AND METHOD

This application is a continuation-in-part of application Ser. No. 08/620,902, entitled "Transmit Clock Generation System and Method", filed Mar. 25, 1996, now abandoned.

BACKGROUND OF THE INVENTION

The invention relates to a system and method for generating transmit clock timing and, more particularly, to a system and method for generating transmit clock timing based on receive clock timing in a communications system, such as a digital cordless telephone.

In electronic communications systems, timing of transmissions and receptions is important. In communications between units of those systems, the units must have sufficient transmission and reception timing capabilities to achieve desired communications. In many of those systems, certain synchronization of timing among communications units is necessary for accomplishing the communications. One particular application in which synchronization of timing is important is communications between a base unit and hand unit of a digital cordless telephone.

System timing synchronization may be achieved in a variety of ways. If the system is a time division multiplex system, then transmissions and receptions of communications between units of the system occur at different times over the same radio frequency. In such a system, synchronization of timing of units is necessary to ensure appropriate signal transmission and reception, without loss of transmitted and received data.

Though there are various ways to achieve synchronization in electronics communication systems, a typical way to synchronize two communicating units has been to make one of the units a timing slave to the other unit. In a digital cordless telephone, for example, a base unit may serve as a timing master and a hand unit may serve as a timing slave. In such an arrangement, the receive timing of the hand unit may be derived from the base unit transmission timing via a signal received by the hand unit from the base unit. The transmit timing of the hand unit may, then, be derived, for example, from the receive timing as is typical. In this manner, synchronization of timing among the base unit and hand unit is achieved.

A typical arrangement for achieving synchronization according to this typical synchronization scheme employs a phase lock loop in the slave unit, presumed herein to be the hand unit (for purposes of discussion only, and not intended to be limited to that case). The phase lock loop serves to lock on the signal received by the hand unit and to recover a timing signal (herein sometimes "clock") from that received signal. The received signal, itself, is then utilized by the hand unit to dictate the hand unit timing. In this typical configuration, transmit timing of the hand unit is derived directly from the receive timing, and the phase lock loop is employed to compensate for jitter of the received signal and to lock on that signal in order to derive transmit timing. When the received signal so dictates timing of the hand unit, the hand unit acts as a timing slave to the base unit, thereby resulting in synchronization.

This typical arrangement has certain disadvantages. In particular, because the transmit timing is derived directly from the received signal and phase lock loop operations, the jitter on the transmit timing is dictated by the worst jitter on the received signal. This can have particularly undesirable effects in instances, for example, of a bad channel over which the received signal is communicated to the hand unit by the base unit. In such an instance, the jitter from the bad channel is imprinted to the transmit timing because the transmit timing is derived from the received signal. Furthermore, the transmit timing derived from the received signal may be jumpy because of the adjustments made in the timing of the received signal via employment of the phase lock loop of the hand unit.

What is needed is a system that reduces jitter effects on the transmit timing, and that requires fewer adjustments to the timing to maintain synchronization.

SUMMARY OF THE INVENTION

The present invention provides a method and an apparatus for generating a transmit clock timing signal of a first communications unit of a communications system, the communications system including the first communications unit and a second communications unit, each capable of communications with the other, the first communications unit having a first internal clock and the second communications unit having a second internal clock. According to one example embodiment, the method comprises the steps of: (1) the first communications unit receiving from the second communications unit a receive data signal; (2) accumulating phase errors in a receive reference clock relative to the receive data signal; (3) adjusting the receive reference clock to track the receive data signal to obtain an adjusted receive reference clock that tracks the receive data signal; (4) accumulating the adjustments made in the adjusting step; (5) applying the adjustments accumulated to vary the first internal clock in order to slave the first internal clock to the second internal clock of the second communications unit so as to generate an adjusted receive reference clock that is the adjusted and slaved first internal clock; and (6) generating a transmit clock timing signal from the adjusted receive reference clock.

The present invention reduces jitter effects on the transmit timing, and requires fewer adjustments to the timing to maintain synchronization. In another feature of the invention,

BRIEF DESCRIPTION OF THE DRAWINGS

FIG. 3 is a simplified schematic of the chain (30) of dividers and multipliers of FIG. 1a;

DESCRIPTION OF THE PREFERRED EMBODIMENT

Figure 1A:
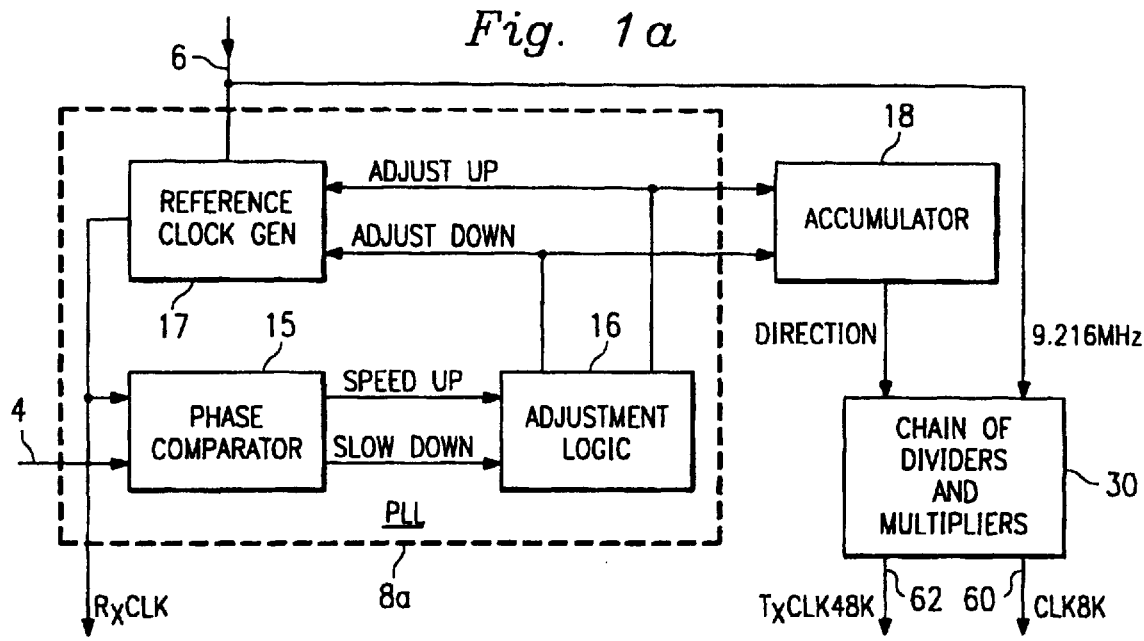
FIG. 1a is a block diagram of a circuit according to the present invention, for slaving the transmit clock and receive clock timing of a communications unit to another unit acting as master timer.
Figure 1:
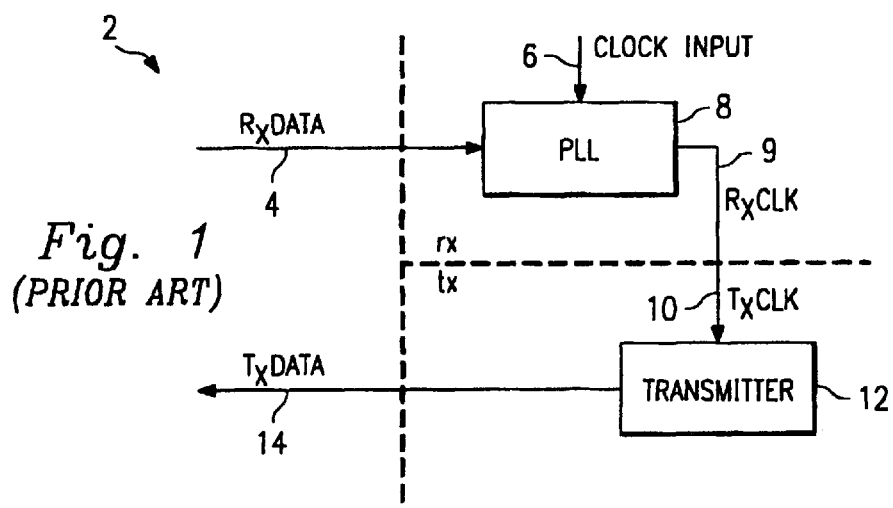
FIG. 1 is a simplified scheme and configuration previously employed in slaving the transmit clock and receive clock timing of a communications unit to another unit acting as master timer.

Referring to FIG. 1, a typical transmit clock generation scheme and unit 2 is illustrated. In the typical scheme and unit 2, a receive data signal 4 is received by the unit 2 from another unit (not shown in FIG. 1). The unit 2 is maintained as a timing slave to the other unit which is the timing master. The receive data signal 4 is picked up by a phase lock loop 8 of the unit 2. This phase lock loop 8 is controlled by a clock 6. The clock 6 is derived internally to the unit 2 from a crystal (not shown in FIG. 1) of the unit 2.

A receive reference clock ("RxCLK") 9 has, in the past, been adjusted based on activity of the phase lock loop 8 in locking on the receive data signal 4. One conventional approach to the adjustment has been to derive within the unit 2 certain up and down signals from the phase lock loop 8 that serve to increase or decrease the frequency of the timing of the unit 2. The up and down signals control a divisor value that effects the frequency increase or decrease. The operations of the phase lock loop 8 in controlling the divisor value of a counter (not shown) give an adjusted receive reference clock 9. A transmit clock 10 has previously been derived from the receive reference clock 9. Derivation of the transmit clock 10 from the receive reference clock 9 has typically been performed directly using the receive reference clock 9. To achieve adjustment to obtain the transmit clock 10, the phase lock loop 8 approach, as described above with respect to the receive data signal 4, yielding the receive reference clock 9, has been employed.

Figure 2:
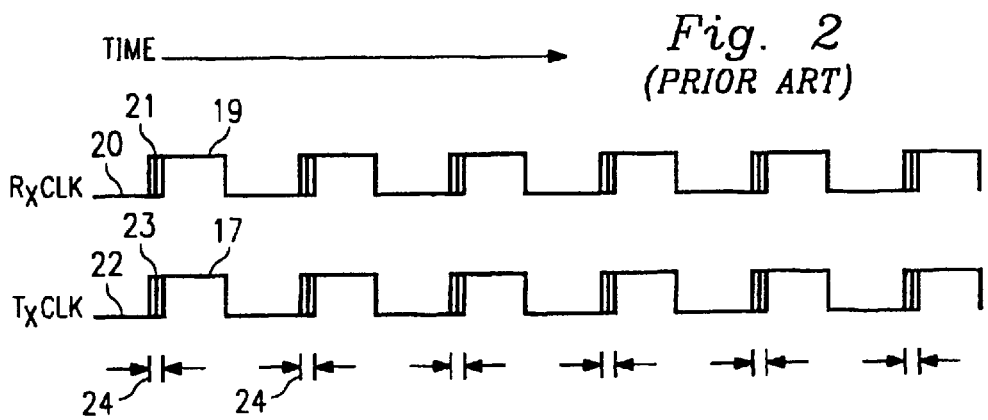
FIG. 2 is an illustration of waveforms of a receive clock and a transmit clock, each slaved to a master in accordance with the prior scheme and configuration of FIG. 1.

Now referring to FIGS. 1 and 2, in conjunction, a receive clock waveform 20 over time is depicted. The waveform 20 is that of the receive reference clock 9 referred to in the preceding paragraph. This receive clock waveform 20 is typical of that of prior units 2 operating as timing slave. It is of note that at each leading edge of a receive clock pulse 19 an adjustment 21 is made to compensate for jitter. This adjustment 21 is made by varying a divisor employed to obtain the receive reference clock 9 having the waveform 20.

Each adjustment 21 of the receive clock waveform 20 is also found as an adjustment 23 in the transmit clock waveform 22. The transmit clock waveform 22 is typical of that of prior units 2 operating as timing slave. Because the prior clock generation schemes directly control the transmit timing from the receive reference clock 9, the transmit clock 10 generated under those schemes was an accurate reflection of the receive reference clock 9. The adjustment for jitter was made using the phase lock loop 8 at each cycle of the transmit timing derived from the receive reference clock 9 in order to yield the transmit clock 10.

The adjustments 21, 23 of the receive clock waveform 20 and the transmit clock waveform 22, respectively, are seen to be over a range 24 of the signal waveforms 20, 22 over time. Because that range 24 varied at each cycle of receive clock and transmit timing under the prior schemes, the transmit clock waveform 22 of the prior methodology was jumpy and varied over each cycle. The present invention provides benefits in these respects.

Referring to FIG. 1a, the receive data signal 4 is an input to a phase lock loop 8a. More specifically, the receive data signal 4 is an input to a phase comparator 15 within the phase lock loop 8a. The phase comparator 15 generates two signals, "SPEED UP" and "SLOW DOWN", which are inputs to an adjustment logic circuitry 16. The adjustment logic circuitry 16 generates two signals, "ADJUST UP", and "ADJUST DOWN", which are inputs to a reference clock generator circuitry 17, and to an accumulator 18. The clock 6 is also an input to the reference clock generator circuitry 17.

The reference clock generator 17 passes the receive reference clock 9 to the phase comparator 15, which compares the receive reference clock 9 to the receive data signal 4. The adjustment logic circuitry 16 adjusts the receive reference clock 9 to track the receive data signal 4, so that the reference clock generator 17 generates an adjusted receive reference clock 9 that tracks the receive data signal 4. The accumulator 18 accumulates the adjustments made by the adjustment logic circuitry 16. The accumulator 18 generates a "DIRECTION" signal, which is an input to a divider chain 30, depicted in FIG. 3. The divider chain 30 uses the DIRECTION signal to change the divisor it uses to divide the clock 6. The result of dividing the clock 6 is a transmit clock ("TxCLK48K") 62, and a CLK8K 60.

Figure 3:
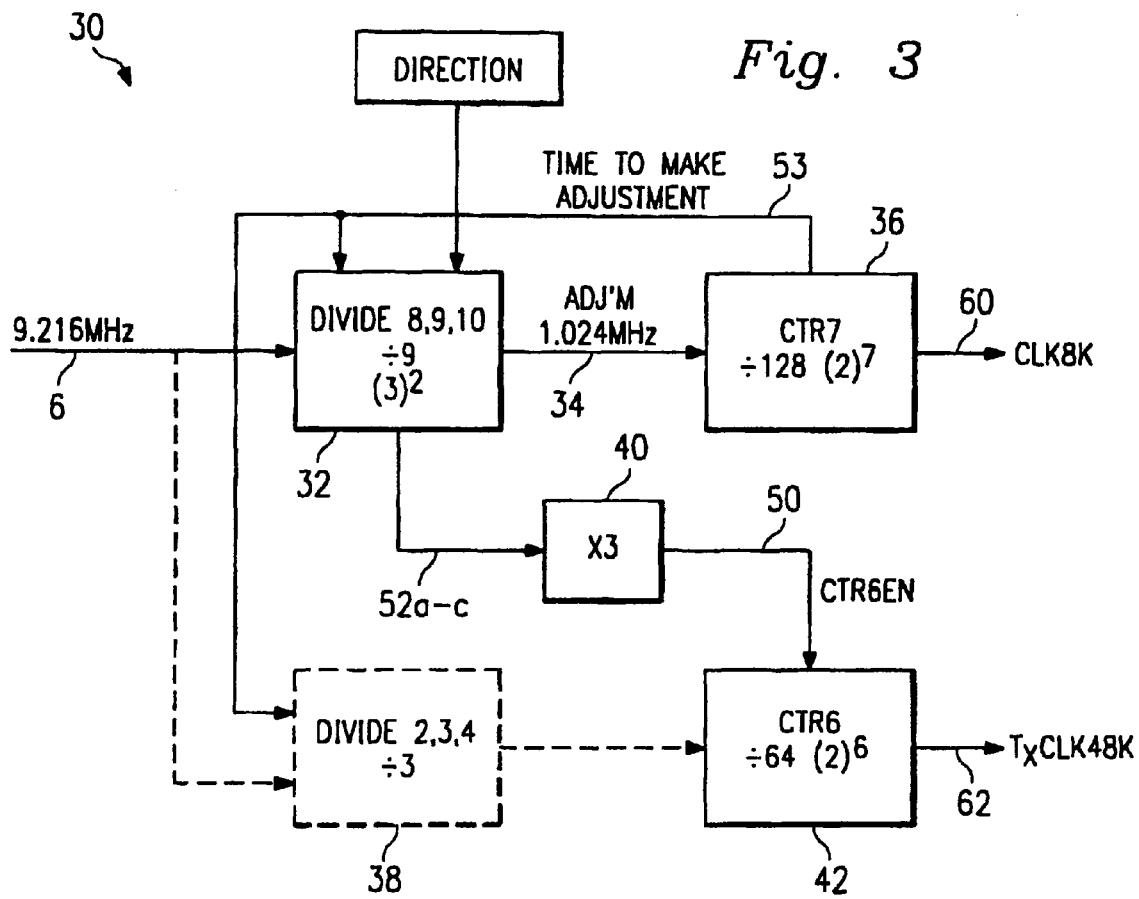
Figure 4:
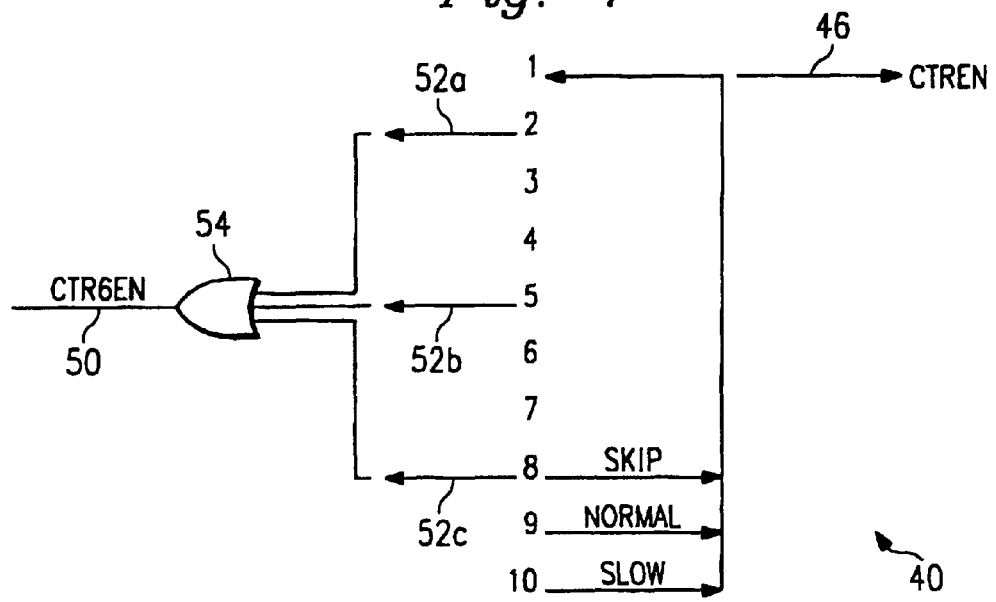
FIG. 4 is an illustration of the operation of the multiply (by 3) circuit 40 of FIG. 3.

FIGS. 3 and 4 together illustrate the chain (30) of dividers and multipliers of FIG. 1a, to obtain the CLK8K 60, an 8 kHz clock, and the transmit clock 62, a 48 kHz clock. In the divider chain 30 of FIG. 3, the clock 6 from the crystal (not shown) of the slave unit is shown as an input. The clock 6 is a 9.216 MHz signal. The clock 6 is, more specifically, an input to a divider (by 8, 9, 10) circuit 32. This divider (by 8, 9, 10) circuit 32 provides for division of the clock 6 by various values, depending on the application. Referring to FIG. 3, the values for the divider may be 8, 9, or 10, because the nominal frequency of the clock 6 is 9.216 MHz. In any event, the particular values and frequencies shown in FIG. 3 are merely examples and other values and frequencies may be employed according to the same concepts of the present invention. Also, as previously described, the particular divider value employed in the divider (by 8, 9, 10) circuit 32 at any instant may be dictated by the particular activity of the phase lock loop 8a (shown in FIG. 1a).

From the divider (by 8, 9, 10) circuit 32, an adjusted signal 34 is generated. The adjusted signal 34 is a 1.024 MHz signal when the divider value 9 is used by the divider (by 8, 9, 10) circuit 32. This adjusted signal 34 is further divided in a counter (ctr7) block 36. In the example of FIG. 3, the counter (ctr7) block 36 operates to divide the adjusted signal 34 by the value 128, yielding a desired CTK8K 60 of 8 kHz for use by the unit. The 8 kHz CLK8K 60 is slaved to the timing of a master unit communicating with the slave unit 2 containing the divider chain 30.

Referring now to FIG. 3, the preferred embodiment of the present invention provides for derivation of the transmit clock 62 from the adjusted signal 34, rather than from the receive reference clock 9 (shown in FIG. 1) as had been previously done. The divide (by 3) block 38 shown in phantom in FIG. 3 is a conceptual illustration, showing what the divider (by 8, 9, 10) circuit 32 and a multiply (by 3) circuit 40 accomplish.

In order to accomplish the derivation of the transmit clock 62 from the adjusted signal 34, rather than from the receive reference clock 9 (FIG. 1), the rate of the signal 34 is multiplied via the multiply (by 3) circuit 40 to achieve the correct resulting nominal frequency of the transmit clock 62. The clock 6 goes to the divider (by 8, 9, 10) circuit 32, where it is divided by 9. Signals 52a–c are output from the divider (by 8, 9, 10) circuit 32, and pass to the multiply (by 3) circuit 40. A resulting signal 50 going to a divider ("CTR6") circuit 42 has a net factor of $(1/9) \times 3 = 1/3$ applied to it. The divide (by 3) block 38 in phantom illustrates that the input to the divider circuit 42 has a rate that is 1/3 of the rate of the input clock 6, i.e., 9.216 MHz/3 in the example. The present invention takes the signal 50 and divides by 64 to produce the transmit clock 62. The net factor of ⅓ from circuits 32 and 40, followed by a factor of ¹⁄₆₄ from the divider circuit 42, times the original 9.216 MHz, yields the 48 kHz transmit clock 62.

The prior schemes, on the other hand, necessarily adjusted both the receive reference clock 9 (shown in FIG. 1), and the transmit timing derived therefrom by employing the phase lock loop 8 (shown in FIG. 1) to compensate for jitter of each of the bits of the receive data signal 4 and the transmit timing derived therefrom. Employing the scheme of the embodiment of the present invention, that is, accumulating all adjustments needed to make the receive reference clock 9 track the receive data signal 4, applying those adjustments in a small magnitude at a much slower rate to yield the adjusted signal 34, and then deriving the transmit clock 62 from the adjusted signal 34, provides advantages of requiring less adjustment, as well as possibly limiting jumpiness of the resulting transmit clock 62. If the particular transmit clock 62 generated by the present scheme is a 48K signal, as in FIG. 3, a signal from the multiply (by 3) circuit 40 is passed to the divider circuit 42 for division by the value 64. That division yields the transmit clock 62 as a 48K signal.

In summary, FIG. 3 illustrates a divider chain circuit which has a divider circuit 32 having multiple states, responsive to a time-to-adjust signal 53, to generate an adjusted 1.024 MHz signal 34. The multiply (by 3) circuit 40, responsive to the multiple states of the divider circuit 32, takes the logical OR of three of the multiple states (See FIG. 4), to generate the adjusted 3.072 MHz signal 50. The divider circuit 42, responsive to the adjusted 3.072 MHz signal 50, generates the transmit clock 62, wherein the transmit clock is one-sixty-fourth of the rate of the adjusted 3.072 MHz signal 50. The divider circuit 36, responsive to the adjusted 1.024 MHz signal 34, generates the time-to-adjust signal 53. The divider circuit circuit 32 is responsive to the time-to-adjust signal 53 to generate the adjusted 1.024 MHz signal 34. The divider circuit 42 generates the transmit clock 62.

Now referring to FIG. 4, the numbers 1–10 indicate states of the divider (by 8, 9, 10) circuit 32 (shown in FIG. 3) during each repetition of the divider (by 8, 9, 10) circuit 32 operation. As previously mentioned, the phase lock loop 8*a* (FIG. 1*a*) of the slave unit 2 dictate the particular divider value to be employed at any instance by the divider (by 8, 9, 10) circuit 32. Thus, the numbers 1–10 symbolize various states of the divider (by 8, 9, 10) circuit 32 according to the particular divider value then being employed. As also previously mentioned, in the example of a 9.216 MHz clock 6 (shown in FIG. 3) of the slave unit from its crystal (not shown), the nominal divider is the value 9 and adjustment is made to compensate for jitter by periodically dividing by any of the values 8, 9, or 10, as appropriate, in attempts to maintain that nominal frequency. In any instance, then, the divider (by 8, 9, 10) circuit 32 will have states 1–8 and additionally will have state 9 when 9 is the divider value and states 9 and 10 when 10 is the divider value of the divider (by 8, 9, 10) circuit 32.

The CTREN signal 46 symbolizes the enablement of the counter (ctr7) block 36, once for each occurrence of the adjusted signal 34, i.e., nominal 1.024 MHz. In order to generate the CTR6EN signal 50 that enables the divider circuit 42 (shown in FIG. 3) to yield the transmit clock 62, three states of the divider (by 8, 9, 10) circuit 32 are detected, states 2, 5, and 8. This detection is symbolized by arrows 52*a*–*c* in FIG. 4. In order to generate the CTR6EN signal 50, the detected states 52*a*–*c* are logically combined in a manner symbolized by the OR gate 54 of the figure.

Figure 5:
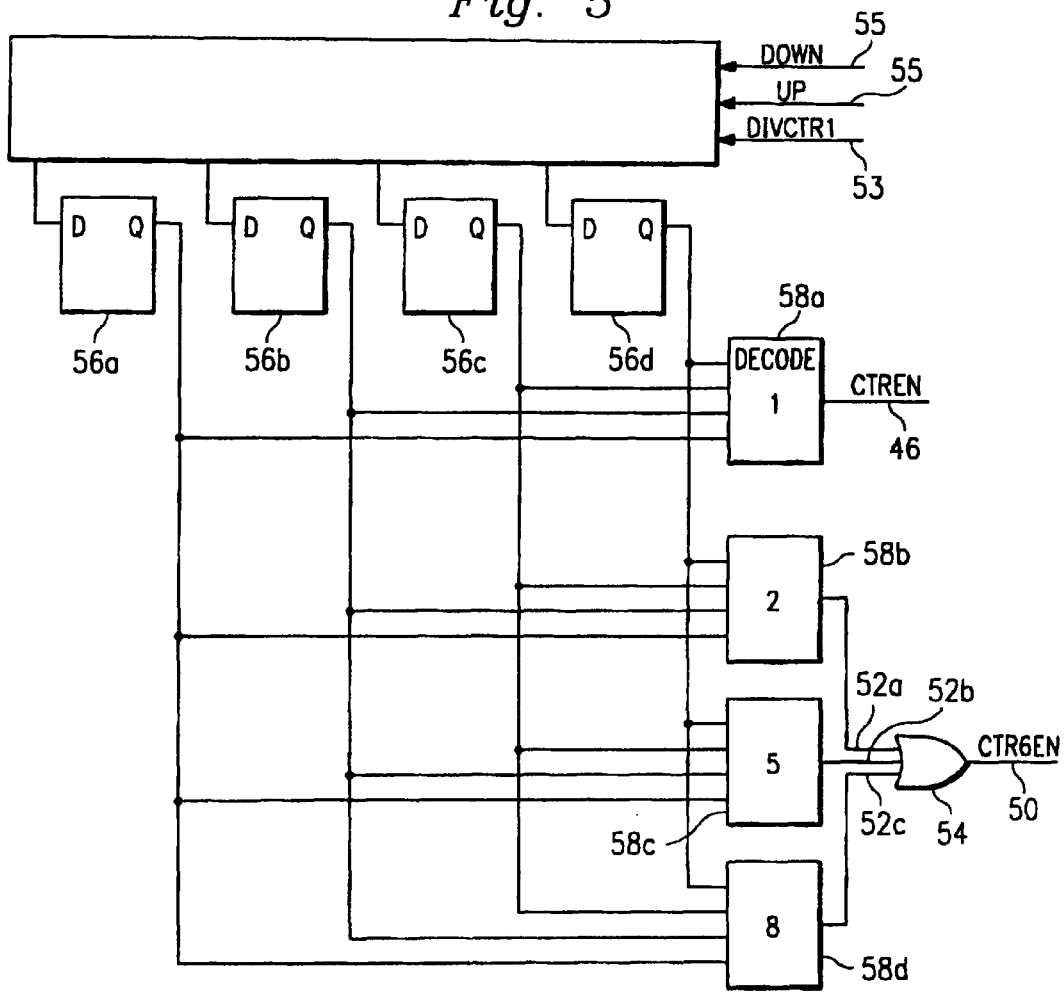
FIG. 5 is a simplified illustration of the divider (by 8, 9, 10) circuit 32 of FIG. 3.

Now referring to FIG. 5, as the divider (by 8, 9, 10) circuit 32 (shown in FIG. 3) repeats each repetition of operation, three output clocks are decoded from the three detected states 52*a*–*c* (shown in FIG. 4). One clock in each cycle of the divider (by 8, 9, 10) circuit 32 is decoded and given to the counter (ctr7) block 36 (shown in FIG. 3). Three other clocks, however, in each cycle of the divider (by 8, 9, 10) circuit 32 are provided to the divider circuit 42 (shown in FIG. 3) to perform the multiply by 3. In effect, the divider (by 8, 9, 10) circuit 32 is decoded at each of the three states 52*a*–*c* during each cycle.

The divider (by 8, 9, 10) circuit 32 is illustrated in FIG. 5. The divider (by 8, 9, 10) circuit 32 detects the down and up adjustment indicators 55 (previously discussed with respect to FIG. 1) from the phase lock loop 8*a*. Based on these down and up adjustment indicators 55, the divider (by 8, 9, 10) circuit 32 employs a particular divider, either 8, 9, or 10. The value 9 is employed when the clock 6 timing is the same as that dictated by the master unit, the value 8 is employed when the master unit dictates a speed up of the timing of the clock 6, and a 10 value is employed when the master unit dictates a slowing of the timing of the clock 6. The divider (by 8, 9, 10) circuit 32 also receives a control indicator 53 which means "make desired adjustment now". The indicator 53 controls activation of the actual "make desired adjustment now" function so that adjustments are made only at a single state of the control (ctr7) block 36 (for example, upon the registering of the rising edge of the CLK8K 60). In this manner, the adjustment of signals 62, 60, and 34 is made only once during the period of the CLK8K 60, which period is the same time frame as six periods of the transmit clock 62. Thus, the transmit clock 62 is adjusted once every six of its periods, during one of the six periods. The five other periods of the transmit clock 62 during which adjustment is not made are each of a uniform duration, without jitter. Adjustments made to timing of the transmit clock 62, as described, are relatively small in comparison to the periods of the transmit clock 62, for example, ¹⁄₉.₂₁₆ MHz or 108 ns. In the prior configuration shown in FIG. 1, the phase lock loop has typically made much larger adjustments such as ¹⁄₁₆ or ¹⁄₃₂ of the 48K period, i.e., 1.302 ps or 651 ns.

The one state related to the CTREN signal 46 and the three detected states 52*a*–*c* are each decoded in a conventional manner. Four flip flops 56*a*–*d* are employed as counters. Through conventional synchronous logic design, those skilled in the art will be able to determine the functions necessary to drive the flip flops 56*a*–*d* in order to make a count in the desired manner. Outputs of Q's of the flip flops 56*a*–*d* are then decoded by decoders 58*a*–*d*. From the decoders 58*b*–*d*, appropriate values indicative of the detected states 52*a*–*c* are generated. The decoded states 52 are then logically OR'd in the OR gate 54 to generate the CTR6EN signal 50.

Referring back to FIG. 3, the result of generating the transmit clock 62 by derivation from the adjusted signal 34, rather than from the clock 6 not yet adjusted, is that the transmit clock 62 need not be adjusted for jitter at each period of the transmit clock 62. This is the case because the resulting transmit clock 62 is generated directly from the adjusted signal 34, not by use of the phase lock loop 8 of the slave unit 2 (shown in FIG. 1), as in the prior schemes. The adjusted signal 34 is already adjusted via use of the phase lock loop 8*a* and jitter integrator (if present) to compensate for jitter, and the transmit clock 62 is derived from the already adjusted signal 34. Furthermore, through this approach, substantial jitter effects are not exhibited by the transmit clock 62 because only one adjustment is made in six periods. This results in smoother transmit timing, as well, because fewer adjustments are actually made to generate the transmit clock 62.

Figure 6:
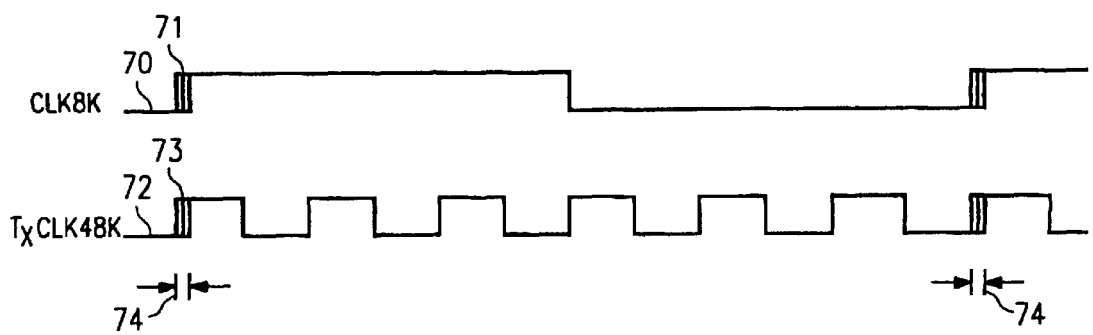
FIG. 6 is an illustration of waveforms of a receive clock slaved to a master (the receive clock is identical to that of FIG. 2) and a transmit clock derived from the adjusted received clock in order to effect slaving of the transmit clock with the master, in accordance with the preferred embodiment of the present invention.

Now referring to FIG. 6, a receive clock waveform 70, according to the 8K clock, and a transmit clock waveform 72, derived according to the preferred embodiment, are shown. In each period of the receive clock waveform 70, an adjustment 71 to allow the waveform 70 to track the timing of the master is made in the manner previously described. Because the transmit clock waveform 72 is derived from the adjusted signal 34 (shown in FIG. 3) rather than from the receive data signal 4 (shown in FIG. 1) as in the conventional schemes, an adjustment 73 to compensate for jitter is made only every sixth period of the transmit clock waveform 72. The range 74 of the adjustments 71 and 73 is smaller than the range 24 of the prior schemes (shown in FIG. 2).

Although the preceding discussion of the embodiments of the present invention and the prior art employ certain values and components to achieve transmit clock generation which is slave to timing dictated by a master, multiple variations and substitutions may be made in the particular embodiments, all in keeping with the concepts of the present invention. Particularly, embodiments of the present invention, in concept, derive a transmit clock from an adjusted clock input of a slave unit based on an already adjusted receive clock. As those skilled in the art will readily appreciate and understand, such concepts are not unique to any particular application of the embodiments or configuration thereof. Thus, although illustrative embodiments of the invention have been shown and described, a wide range of modification, change, and substitution is contemplated in the foregoing disclosure and, in some instances, some features of the present invention may be employed without a corresponding use of the other features. Accordingly, it is appropriate that the appended claims be construed broadly and in a manner consistent with the scope of the invention.

What is claimed is:

1. A method for generating transmit clock timing signal of a first communications unit of a communications system, the communications system including the first communications unit and a second communications unit, each capable of communication with the other, the first communications unit having a first internal clock and the second communications unit having a second internal clock, the method comprising the steps of:

the first communications unit receiving from the second communications unit a receive data signal;

accumulating phase errors in a receive reference clock relative to the receive data signal;

adjusting the receive reference clock to track the receive data signal and, in response, generating an adjusted receive reference clock that tracks the receive data signal;

accumulating the adjustments made in the adjusting step;

applying the adjustments accumulated to vary the first internal clock and tracking the second internal clock to slave the first internal clock to the second internal clock of the second communications unit so as to generate an adjusted receive reference clock that is the adjusted and slaved first internal clock; and using a frequency divider/multiplier circuit, generating a transmit clock timing signal from the adjusted receive reference clock; wherein the divider/multiplier circuit further comprising:

a first divider circuit having an input connected to an internal clock of the system;

an input of a multiply-by-n (n>1) circuit connected to a first output of the first divider circuit;

a second divider circuit connected to an output of the multiply-by-n circuit; and a third divider circuit connected to a second output of the first divider circuit, wherein the second divider circuit generates the transmit clock timing signal at an output of the second divider circuit.

2. The method of claim 1, wherein the adjusting step is performed by a phase lock loop.

3. The method of claim 2, wherein the accumulating step accumulates up and down signals from the phase lock loop.

4. The method of claim 1, wherein the applying step varies the first internal clock less frequently than the adjusting step varies the receive data signal.

5. The method of claim 4, wherein the transmit clock tracks the timing of the adjusted signal.

6. An apparatus for generating transmit clock timing of a first communications unit of a communications system, the communications system including the first communications unit and a second communications unit each capable of communications with the other, the first communications unit having a first internal clock and the second communications unit having a second internal clock, the second communications unit sending a receive data signal received by the first communications unit, the apparatus comprising:

an adjuster, incorporated with the first communications unit, for adjusting a receive reference clock to generate an adjusted receive reference clock that tracks the receive data signal;

an accumulator, communicably connected with the adjuster, for accumulating the adjustments made by the adjuster;

first means, communicably connected with the accumulator, for applying the adjustments accumulated to vary the first internal clock in order to slave the first internal clock to the second internal clock of the second communications unit so as to generate an adjusted signal that is the adjusted and slaved first internal clock; and second means, including a frequency divider/multiplier circuit and communicably connected with the first means, for deriving a transmit clock from the adjusted signal; wherein the divider/multiplier circuit further comprising:

a first divider circuit having an input connected to an internal clock of the system;

an input of a multiply-by-n (n>1) circuit connected to a first output of the first divider circuit;

a second divider circuit connected to an output of the multiply-by-n circuit; and a third divider circuit connected to a second output of the first divider circuit, wherein the second divider circuit generates the transmit clock timing signal at an output of the second divider circuit.

7. The apparatus of claim 6, wherein the adjuster includes a phase lock loop.

8. The apparatus of claim 7, wherein the accumulator is a counter having multiple states during each count repetition, the multiple states being each dictated by the adjuster.

9. The apparatus of claim 8, wherein the first means selectively applies the states of the counter in order to vary the first internal clock less frequently than the adjuster adjusts the receive reference clock to generate the adjusted signal.

10. The apparatus of claim 9, wherein the transmit clock derived by the second means has variation only as frequently as does the adjusted signal.

11. An apparatus for generating a transmit clock timing signal of a first communications unit of a communications system, the communications system including the first communications unit and a second communications unit each capable of communications with the other, the first communications unit having a first internal clock and the second communications unit having a second internal clock, the second communications unit sending a receive data signal received by the first communications unit, the apparatus including a divider chain circuit, the divider chain circuit comprising:
- a first divider circuit having multiple states, responsive to a time-to-adjust signal, to generate an adjusted 1.024 MHz signal;
- a multiply-by-three circuit, responsive to the multiple states of the first divider circuit, to take the logical OR of three of the multiple states, to generate an adjusted 3.072 MHz signal;
- a second divider circuit, responsive to the adjusted 3.072 MHz signal, to generate a transmit clock, wherein the transmit clock is one-sixty-fourth of the rate of the adjusted 3.072 MHz signal; and
- a third divider circuit, responsive to the adjusted 1.024 MHz signal, to generate the time-to-adjust signal, wherein the second divider circuit generates the transmit clock timing signal.

12. An apparatus for generating a transmit clock timing signal of a first communications unit of a communications system, the communications system including the first communications unit and a second communications unit each capable of communications with the other, the first communications unit having a first internal clock and the second communications unit having a second internal clock, the second communications unit sending a receive data signal received by the first communications unit, the apparatus including a divider chain circuit, the divider chain circuit comprising:
- a first divider circuit having an input connected to an internal clock of the system;
- an input of a multiply-by-three circuit connected to a first output of the first divider circuit;
- a second divider circuit connected to an output of the multiply-by-three circuit; and
- a third divider circuit connected to a second output of the first divider circuit, wherein the second divider circuit generates the transmit clock timing signal at an output of the second divider circuit.

13. A method for generating transmit clock timing signal of a first communications unit of a communications system, the communications system including the first communications unit and a second communications unit, each capable of communication with the other, the first communications unit having a first internal clock and the second communications unit having a second internal clock, the method comprising the steps of:
- the first communications unit receiving from the second communications unit a receive data signal;
- accumulating phase errors in a receive reference clock relative to the receive data signal and adjusting the receive reference clock to track the receive data signal and, in response, generating an adjusted receive reference clock that tracks the receive data signal;
- accumulating the adjustments made in the adjusting step;
- applying the adjustments accumulated to vary the first internal clock and tracking the second internal clock to slave the first internal clock to the second internal clock of the second communications unit so as to generate an adjusted receive reference clock that is the adjusted and slaved first internal clock; and
- generating a transmit clock timing signal from the adjusted receive reference clock; wherein the divider/multiplier circuit further comprising:
  - a first divider circuit having an input connected to an internal clock of the system;
  - an input of a multiply-by-n (n>1) circuit connected to a first output of the first divider circuit;
  - a second divider circuit connected to an output of the multiply-by-n circuit; and
  - a third divider circuit connected to a second output of the first divider circuit, wherein the second divider circuit generates the transmit clock timing signal at an output of the second divider circuit.

14. The method of claim 13, wherein the transmit clock tracks the timing of the adjusted signal.

15. A method for generating transmit clock timing signal of a first communications unit of a communications system, the communications system including the first communications unit and a second communications unit, each capable of communication with the other, the first communications unit having a first internal clock and the second communications unit having a second internal clock, the method comprising the steps of:
- the first communications unit receiving from the second communications unit a receive data signal;
- adjusting a receive reference clock to track the receive data signal and, in response, generating an adjusted receive reference clock that tracks the receive data signal;
- modifying the first internal clock and tracking the second internal clock to slave the first internal clock to the second internal clock of the second communications unit so as to generate an adjusted receive reference clock that is the adjusted and slaved first internal clock, wherein the modifying step varies the first internal clock less frequently than the adjusting step varies the receive data signal; and
- generating a transmit clock timing signal from the adjusted receive reference clock; wherein the divider/multiplier circuit further comprising:
  - a first divider circuit having an input connected to an internal clock of the system;
  - an input of a multiply-by-n (n>1) circuit connected to a first output of the first divider circuit;
  - a second divider circuit connected to an output of the multiply-by-n circuit; and
  - a third divider circuit connected to a second output of the first divider circuit, wherein the second divider circuit generates the transmit clock timing signal at an output of the second divider circuit.

16. The method of claim 15, wherein the transmit clock tracks the timing of the adjusted signal.

17. A method for generating transmit clock timing signal of a first communications unit of a communications system, the communications system including the first communications unit and a second communications unit, each capable of communication with the other, the first communications unit having a first internal clock and the second communications unit having a second internal clock, the method comprising the steps of:

the first communications unit receiving from the second communications unit a receive data signal;

adjusting a receive reference clock to track the receive data signal and, in response, generating an adjusted receive reference clock that tracks the receive data signal;

varying the first internal clock and tracking the second internal clock to slave the first internal clock to the second internal clock of the second communications unit so as to generate an adjusted receive reference clock that is the adjusted and slaved first internal clock; and using a frequency divider/multiplier circuit, generating a transmit clock timing signal from the adjusted receive reference clock; wherein the divider/multiplier circuit further comprising:

a first divider circuit having an input connected to an internal clock of the system;

an input of a multiply-by-n (n>1) circuit connected to a first output of the first divider circuit;

a second divider circuit connected to an output of the multiply-by-n circuit; and a third divider circuit connected to a second output of the first divider circuit, wherein the second divider circuit generates the transmit clock timing signal at an output of the second divider circuit.

18. The method of claim 17, wherein the transmit clock tracks the timing of the adjusted signal.

19. The method of claim 18, wherein the varying step varies the first internal clock less frequently than the adjusting step varies the receive data signal.

20. A transmit clock generation arrangement for generating transmit clock timing signal of a first communications unit of a communications system, the communications system including the first communications unit and a second communications unit, each capable of communication with the other, the transmit clock generation arrangement operating according to the method of claim 17.

* * * * *